United States Patent [19]
Hotta

[11] Patent Number: 5,668,772
[45] Date of Patent: Sep. 16, 1997

[54] SEMICONDUCTOR MEMORY DEVICE AND ACCESS METHOD FOR THE SAME

[75] Inventor: Yasuhiro Hotta, Nara, Japan

[73] Assignee: Sharp Kabushiki Kaisha, Osaka, Japan

[21] Appl. No.: 713,664

[22] Filed: Sep. 13, 1996

[30] Foreign Application Priority Data

Nov. 13, 1995 [JP] Japan .................................. 7-294606

[51] Int. Cl.$^6$ .................................................. G11C 8/00
[52] U.S. Cl. .................. 365/230.06; 365/230.08; 365/240
[58] Field of Search .................. 365/230.08, 230.06, 365/240, 239

[56] References Cited

U.S. PATENT DOCUMENTS

| | | | |
|---|---|---|---|
| 5,369,621 | 11/1994 | Mason | 365/230.06 |
| 5,495,454 | 2/1996 | Fijkuzo | 365/230.06 |
| 5,528,551 | 6/1996 | Pinkham | 365/230.06 |
| 5,579,268 | 11/1996 | Seo et al. | 365/230.06 |

FOREIGN PATENT DOCUMENTS 6-275073  9/1994  Japan .

Primary Examiner—Son T. Dinh
Attorney, Agent, or Firm—Morrison & Foerster LLP

[57] ABSTRACT

A semiconductor memory device comprising a memory cell array includes a plurality of memory cells. The device includes: a predecoder for dividing a plurality of bits of an address signal into at least two bit strings so as to decode each bit string and output predecoded results of each bit string in parallel; a series of shift registers, each shift register being provided for a respective bit string, receiving the predecoded results of the corresponding bit string as shift data, shifting the received shift data, thereby generating and outputting predecoded signal bits; and a main decoder for decoding the predecoded signal bits output from the plurality of shift registers and selecting a memory cell in the memory cell array in accordance with the results of the decoding.

8 Claims, 18 Drawing Sheets

PRIOR ART

PRIOR ART

PRIOR ART

FIG. 9

| A2 A1 A0 | CA7 CA6 CA5 CA4 CA3 CA2 CA1 CA0 |
|---|---|
| 0 0 0 | 0 0 0 0 0 0 0 1 |
| 0 0 1 | 0 0 0 0 0 0 1 0 |
| 0 1 0 | 0 0 0 0 0 1 0 0 |
| 0 1 1 | 0 0 0 0 1 0 0 0 |
| 1 0 0 | 0 0 0 1 0 0 0 0 |
| 1 0 1 | 0 0 1 0 0 0 0 0 |
| 1 1 0 | 0 1 0 0 0 0 0 0 |
| 1 1 1 | 1 0 0 0 0 0 0 0 |

FIG.10

| A6 A5 A4 A3 | CB15 | CB14 | CB13 | ... | CB4 | CB3 | CB2 | CB1 | CB0 |
|---|---|---|---|---|---|---|---|---|---|
| 0 0 0 0 | 0 | 0 | 0 | ... | 0 | 0 | 0 | 0 | 1 |
| 0 0 0 1 | 0 | 0 | 0 | ... | 0 | 0 | 0 | 1 | 0 |
| 0 0 1 0 | 0 | 0 | 0 | ... | 0 | 0 | 1 | 0 | 0 |
| 0 0 1 1 | 0 | 0 | 0 | ... | 0 | 1 | 0 | 0 | 0 |
| 0 1 0 0 | 0 | 0 | 0 | ... | 1 | 0 | 0 | 0 | 0 |
| 0 1 0 1 | 0 | 0 | 0 | ... | 0 | 0 | 0 | 0 | 0 |
| 0 1 1 0 | 0 | 0 | 0 | ... | 0 | 0 | 0 | 0 | 0 |
| 0 1 1 1 | 0 | 0 | 0 | ... | 0 | 0 | 0 | 0 | 0 |
| 1 0 0 0 | 0 | 0 | 0 | ... | 0 | 0 | 0 | 0 | 0 |
| 1 0 0 1 | 0 | 0 | 0 | ... | 0 | 0 | 0 | 0 | 0 |
| 1 0 1 0 | 0 | 0 | 0 | ... | 0 | 0 | 0 | 0 | 0 |
| 1 0 1 1 | 0 | 0 | 0 | ... | 0 | 0 | 0 | 0 | 0 |
| 1 1 0 0 | 0 | 0 | 0 | ... | 0 | 0 | 0 | 0 | 0 |
| 1 1 0 1 | 0 | 0 | 1 | ... | 0 | 0 | 0 | 0 | 0 |
| 1 1 1 0 | 0 | 1 | 0 | ... | 0 | 0 | 0 | 0 | 0 |
| 1 1 1 1 | 1 | 0 | 0 | ... | 0 | 0 | 0 | 0 | 0 |

FIG.12

| A10 | A9 | A8 | A7 | RA15 | RA14 | RA13 | ... | RA4 | RA3 | RA2 | RA1 | RA0 |
|---|---|---|---|---|---|---|---|---|---|---|---|---|
| 0 | 0 | 0 | 0 | 0 | 0 | 0 | ... | 0 | 0 | 0 | 0 | 1 |
| 0 | 0 | 0 | 1 | 0 | 0 | 0 | ... | 0 | 0 | 0 | 1 | 0 |
| 0 | 0 | 1 | 0 | 0 | 0 | 0 | ... | 0 | 0 | 1 | 0 | 0 |
| 0 | 0 | 1 | 1 | 0 | 0 | 0 | ... | 0 | 1 | 0 | 0 | 0 |
| 0 | 1 | 0 | 0 | 0 | 0 | 0 | ... | 1 | 0 | 0 | 0 | 0 |
| 0 | 1 | 0 | 1 | 0 | 0 | 0 | ... | 0 | 0 | 0 | 0 | 0 |
| 0 | 1 | 1 | 0 | 0 | 0 | 0 | ... | 0 | 0 | 0 | 0 | 0 |
| 0 | 1 | 1 | 1 | 0 | 0 | 0 | ... | 0 | 0 | 0 | 0 | 0 |
| 1 | 0 | 0 | 0 | 0 | 0 | 0 | ... | 0 | 0 | 0 | 0 | 0 |
| 1 | 0 | 0 | 1 | 0 | 0 | 0 | ... | 0 | 0 | 0 | 0 | 0 |
| 1 | 0 | 1 | 0 | 0 | 0 | 0 | ... | 0 | 0 | 0 | 0 | 0 |
| 1 | 0 | 1 | 1 | 0 | 0 | 0 | ... | 0 | 0 | 0 | 0 | 0 |
| 1 | 1 | 0 | 0 | 0 | 0 | 0 | ... | 0 | 0 | 0 | 0 | 0 |
| 1 | 1 | 0 | 1 | 0 | 0 | 1 | ... | 0 | 0 | 0 | 0 | 0 |
| 1 | 1 | 1 | 0 | 0 | 1 | 0 | ... | 0 | 0 | 0 | 0 | 0 |
| 1 | 1 | 1 | 1 | 1 | 0 | 0 | ... | 0 | 0 | 0 | 0 | 0 |

FIG.13

| A14 | A13 | A12 | A11 | RB15 | RB14 | RB13 | ... | RB4 | RB3 | RB2 | RB1 | RB0 |
|---|---|---|---|---|---|---|---|---|---|---|---|---|
| 0 | 0 | 0 | 0 | 0 | 0 | 0 | ... | 0 | 0 | 0 | 0 | 1 |
| 0 | 0 | 0 | 1 | 0 | 0 | 0 | ... | 0 | 0 | 0 | 1 | 0 |
| 0 | 0 | 1 | 0 | 0 | 0 | 0 | ... | 0 | 0 | 1 | 0 | 0 |
| 0 | 0 | 1 | 1 | 0 | 0 | 0 | ... | 0 | 1 | 0 | 0 | 0 |
| 0 | 1 | 0 | 0 | 0 | 0 | 0 | ... | 1 | 0 | 0 | 0 | 0 |
| 0 | 1 | 0 | 1 | 0 | 0 | 0 | ... | 0 | 0 | 0 | 0 | 0 |
| 0 | 1 | 1 | 0 | 0 | 0 | 0 | ... | 0 | 0 | 0 | 0 | 0 |
| 0 | 1 | 1 | 1 | 0 | 0 | 0 | ... | 0 | 0 | 0 | 0 | 0 |
| 1 | 0 | 0 | 0 | 0 | 0 | 0 | ... | 0 | 0 | 0 | 0 | 0 |
| 1 | 0 | 0 | 1 | 0 | 0 | 0 | ... | 0 | 0 | 0 | 0 | 0 |
| 1 | 0 | 1 | 0 | 0 | 0 | 0 | ... | 0 | 0 | 0 | 0 | 0 |
| 1 | 0 | 1 | 1 | 0 | 0 | 0 | ... | 0 | 0 | 0 | 0 | 0 |
| 1 | 1 | 0 | 0 | 0 | 0 | 0 | ... | 0 | 0 | 0 | 0 | 0 |
| 1 | 1 | 0 | 1 | 0 | 0 | 1 | ... | 0 | 0 | 0 | 0 | 0 |
| 1 | 1 | 1 | 0 | 0 | 1 | 0 | ... | 0 | 0 | 0 | 0 | 0 |
| 1 | 1 | 1 | 1 | 1 | 0 | 0 | ... | 0 | 0 | 0 | 0 | 0 |

FIG.14

| A18 A17 A16 A15 | RC15 RC14 RC13 ... RC4 RC3 RC2 RC1 RC0 |
|---|---|
| 0 0 0 0 | 0 0 0 ... 0 0 0 0 1 |
| 0 0 0 1 | 0 0 0 ... 0 0 0 1 0 |
| 0 0 1 0 | 0 0 0 ... 0 0 1 0 0 |
| 0 0 1 1 | 0 0 0 ... 0 1 0 0 0 |
| 0 1 0 0 | 0 0 0 ... 1 0 0 0 0 |
| 0 1 0 1 | 0 0 0 ... 0 0 0 0 0 |
| 0 1 1 0 | 0 0 0 ... 0 0 0 0 0 |
| 0 1 1 1 | 0 0 0 ... 0 0 0 0 0 |
| 1 0 0 0 | 0 0 0 ... 0 0 0 0 0 |
| 1 0 0 1 | 0 0 0 ... 0 0 0 0 0 |
| 1 0 1 0 | 0 0 0 ... 0 0 0 0 0 |
| 1 0 1 1 | 0 0 0 ... 0 0 0 0 0 |
| 1 1 0 0 | 0 0 0 ... 0 0 0 0 0 |
| 1 1 0 1 | 0 0 1 ... 0 0 0 0 0 |
| 1 1 1 0 | 0 1 0 ... 0 0 0 0 0 |
| 1 1 1 1 | 1 0 0 ... 0 0 0 0 0 |

SEMICONDUCTOR MEMORY DEVICE AND ACCESS METHOD FOR THE SAME

BACKGROUND OF THE INVENTION

1. Field of the Invention

The present invention relates to a semiconductor memory device for decoding an address signal to access a memory cell array.

2. Description of the Related Art

In recent years, as the operating rate of a micro processor increased, speedy operation of a semiconductor memory device has been increasingly demanded. In order to promote speedy operation, it is important to raise accessing speed during ordinary random access. However, promotion of the accessing speed is physically limited. Thus, for example, a semiconductor with a high speed access operation mode called a burst mode has been developed so as to access successive addresses at high speed.

FIG. 1 shows an exemplary configuration of a conventional semiconductor memory device 200 including the burst mode. Herein, a memory cell array 201 of the semiconductor memory device 200 is accessed by an address signal represented by 19 bits (address signal bits $A_{18}$ to $A_0$. The address signal bits $A_{18}$ to $A_0$ are divided into column address signal bits $A_6$ to $A_0$ of least significant 7 bits, and row address signal bits $A_{18}$ to $A_7$ of most significant 12 bits.

The column address signal bits $A_6$ to $A_0$ and the row address signal bits $A_{18}$ to $A_7$ are externally input and both supplied to a single latch counter 204 via a column address input buffer 202 and a row address input buffer 203, respectively. When an address load enable signal (hereinafter, referred to as an ALE signal) goes from H level (high voltage level) to L level (low voltage level), the address signal bits $A_{18}$ to $A_0$ are loaded to the latch counter 204. The latch counter 204, which loads 19 bits, loads the column address signal bits $A_6$ to $A_0$ as its least significant 7 bits and the row address signal bits $A_{18}$ to $A_7$ as its most significant 12 bits in accordance with the ALE signal. Then, the latch counter 204 counts in accordance with a clock signal, using the address signal bits $A_{18}$ to $A_0$ as the initial values. Then, the least significant 7 bits out of the counted results are output as internal column address signal bits $A_6$ to $A_0$, and the most significant 12 bits are output as internal row address signal bits $A_{18}$ to $A_7$. In addition to the internal column address signal bits $A_6$ to $A_0$ and the internal row address signal bits $A_{18}$ to $A_7$, the latch counter 204 also outputs inverted signal bits $A_6$ bar to $A_0$ bar and inverted signal bits $A_{18}$ bar to $A_7$ bar obtained by inverting the address signal bits $A_{18}$ to $A_0$.

The internal column address signal bits $A_6$ to $A_0$ and the inverted signal bits $A_6$ bar to $A_0$ bar are input to a column predecoder 205. The column predecoder 205 consists of a least significant decoder 205a and a most significant decoder 205b. The 7 internal column address signal bits $A_6$ to $A_0$ are further divided into internal column address signal bits $A_2$ to $A_0$ of least significant 3 bits and internal column address signal bits $A_6$ to $A_3$ of most significant 4 bits. The internal column address signal bits $A_2$ to $A_0$ are decoded in the least significant decoder 205a shown in FIG. 2, and the internal column address signal bits $A_6$ to $A_3$ are decoded in the most significant decoder 205b shown in FIG. 3. In other words, the internal column address signal bits $A_2$ to $A_0$ and the inverted signal bits $A_2$ bar to $A_0$ bar of the least significant 3 bits are decoded by the least significant decoder 205a shown in FIG. 2. Then, decoded results $CA_7$ to $CA_0$ of 8 bits $(=2^3)$ where any one of the bits is at H level are output. Furthermore, the internal row address signal bits $A_6$ to $A_3$ and the inverted signal bits $A_6$ bar to $A_3$ bar of the most significant 4 bits are decoded in the most significant decoder 205b shown in FIG. 3. Then, the decoded results of the 16 bits $(=2^4)$ $CB_{15}$ to $CB_6$ where any one of the bits is at H level are output. These decoded results $CA_7$ to $CA_0$ and $CB_{15}$ to $CB_0$ are input to a column decoder/selector 206.

The internal row address signal bits $A_{18}$ to $A_7$ and the inverted signal bits $A_{18}$ bar to $A_7$ bar are input to a row predecoder 207. The row predecoder 207 consists of a least significant decoder, an intermediate decoder and a most significant decoder. The internal row address signal bits $A_{18}$ and $A_7$ of 12 bits are further divided into the internal row address signal bits $A_{10}$ to $A_7$ of the least significant 4 bits, the internal row address signal bits $A_{14}$ to $A_{11}$ of intermediate 4 bits and the internal row address signal bits $A_{18}$ to $A_{15}$ of the most significant 4 bits. The internal row address signal bits $A_{10}$ to $A_7$, $A_{14}$ to $A_{11}$, and $A_{18}$ and $A_{15}$ are decoded in the least significant decoder, the intermediate decoder and the most significant decoder having the same configuration as the decoder shown in FIG. 3. Accordingly, the decoded results of the 16 bits each $RA_{15}$ to $RA_0$, $RB_{15}$ to $RB_0$ and $RC_{15}$ to $RC_0$ are output from the row predecoder 207. These decoded results are further decoded in a row decoder 208, and thus either one of the word lines WLi in the memory cell array 201 is selected.

The column decoder/selector 206 decodes the decoded results output from the column predecoder 205 to select either one of the bit lines in the memory cell array 201. Thus, a memory cell specified by the word line WLi and the selected bit line can be accessed. In the case of a reading operation, data of the selected memory cell is amplified in a sense amplifier 209 and outputs the amplified data to an external data bus or the like via an output buffer 210.

After completing the access by using the externally input address signal bits $A_{18}$ to $A_0$, as shown in FIG. 4, the latch counter 204 performs a counting operation at a time t11 and a time t12 when a clock signal goes high. Then, the latch counter 204 sequentially counts using the address signal bits $A_{18}$ to $A_0$ previously used for accessing the initial values. Generally, since the internal address signal bits $A_{18}$ to $A_0$ of the least significant bits are changed first, the column predecoder 205 decodes the changed internal address signals and sequentially changes the bits of the decoded results $CA_7$ to $CA_0$ to be at H level. Each time circulation of the decoded results $CA_7$ to $CA_0$ is completed, the bits of the decoded results $CB_{15}$ to $CB_0$ are sequentially changed to be at H level. Accordingly, the column decoder/selector 206 decodes the decoded results $CA_7$ to $CA_0$, $CB_{15}$ to $CB_0$ to sequentially select and access another memory cell in the memory cell array 201. When the clock signals are continuously input, the row address signal bits $A_{18}$ to $A_7$ of most significant bits in the latch counter 204 are changed. Thus, the row predecoder 207 and the row decoder 208 perform the decoding operation so that the selection of the word lines WLi are sequentially switched.

As a result, the semiconductor memory device can sequentially access successive addresses of the memory cell array 201 by supplying internally generated clock signals to the latch counter 204.

However, when the address signal bits $A_{18}$ to $A_0$ are counted by the latch counter 204, as described above, the internal column address signal bits $A_6$ to $A_0$, and the internal row address signal bits $A_{18}$ to $A_7$ in some cases as well are changed. As a result, not only the column decoder/selector 206 and the row decoder 208, but also the column predecoder 205 and the row predecoder 207 perform the decoding operation. Thus, in a conventional semiconductor memory device, delay time which is generated when the column predecoder 205 and the row predecoder 207 perform the predecoding operation, adversely prevents the promotion of speedy access from being promoted. In addition, since a large amount of charged and discharged current flows during the operation of the column predecoder 205 and the row predecoder 207, power consumption is disadvantageously increased.

In order to solve the above-mentioned problems, a semiconductor memory device 300 using shift registers has been conventionally developed (Japanese Laid-Open Patent Publication No. 6-275073). As shown in FIG. 5, the semiconductor memory device does not include the latch counter 204 as is included in the semiconductor memory device 200. A column decoder/selector 306 includes a column shift register 311, and a row decoder 308 includes a row shift register 312. The column shift register 311 receives decoded results from the columndecoder/selector 306 in parallel in accordance with an ALE signal, and circularly shifts values of the shift data in accordance with a clock signal. The row shift register 312 receives decoded results from the row decoder 308 in parallel in accordance with an ALE signal, and circularly shifts values of the shift data each time circulation of the shift data of the column shift register 311 is completed.

Accordingly, in the semiconductor memory device 300, after the column predecoder 305 and the column decoder/selector 306, or the row predecoder 307 and the row decoder 308 decode the address signal bits $A_{18}$ to $A_0$ once, the successive addresses of the memory cell array 301 can be immediately accessed simply by performing the shifting operation by the column shift register 311 and the row shift register 312 without performing the decoding operation ever again. Thus, it is possible to prevent the delay time in the column predecoder 305 and the row predecoder 307 from obstructing the realization of speedy access or increasing power consumption.

However, in such a semiconductor memory device 300 shown in FIG. 5, the column shift register 311 has 128 ($=2^7$) shift stages, and the row shift register 312 has 4096 ($=2^{12}$) shift stages. Thus, a large shift register with a large number of stages is required to be provided. As a result, a layout area for the shift registers on a chip is disadvantageously too large.

Moreover, as described in Japanese Laid-Open Patent Publication No. 6-275073, in the case where a remedy mechanism for remedying an unsatisfactory cell by using a redundant cell as a substitute for accessing to the address of the unsatisfactory cell is provided, it is necessary to determine whether or not the automatically generated address is directed to the unsatisfactory cell by the counting operation performed by an address counter simultaneously with the shift operation performed by the column shift register 311 and the row shift register 312. Thus, the address counter is required to be provided only for detecting the unsatisfactory cell.

SUMMARY OF THE INVENTION

A semiconductor memory device according to the present invention includes a memory cell array including a plurality of memory cells. The device includes a predecoder for dividing a plurality of bits of an address signal into at least two bit strings so as to decode each bit string and output predecoded results of each bit string in parallel; a series of shift registers, each shift register being provided for a respective bit string, receiving the predecoded results of the corresponding bit string as shift data, shifting the received shift data, thereby generating and outputting predecoded signal bits; and a main decoder for decoding the predecoded signal bits output from the plurality of shift registers and selecting a memory cell in the memory cell array in accordance with the results of the decoding.

In one embodiment of the invention, the series of shift registers includes a first shift register provided for a first bit string, for circularly shifting the shift data in accordance with an input clock signal; at least one second shift register provided for at least one second bit string, for circularly shifting shift data thereof each time circulation of shift data in a previous shift register is completed, the shift data being shifted but not circulated in the case where the second shift register is a last shift register.

In another embodiment of the invention, the address signal bit string includes a column address signal bit string and a row address signal bit string, each having a respective plurality of bits. The predecoder includes a column predecoder and a row predecoder provided for the column address signal bits and the row address signal bits, respectively. The column predecoder and the row predecoder output column and row predecoded results in parallel, respectively. The series of shift registers includes group of column shift registers and a group of row shift registers provided for the column predecoder and the row predecoder, respectively. The group of column shift registers receives the column predecoded results so as to generate column predecoded signal bits. The group of row shift registers receives the row predecoded results so as to generate row predecoded signal bits. The main decoder includes a column decoder and a row decoder. The column decoder decodes the column predecoded signal bits and thereby selecting a column address of the memory cells in the memory cell array. The row decoder decoding the row predecoded signal bits and thereby selecting a row address of the memory cells in the memory cell array.

In another embodiment of the invention, the group of column shift registers includes a first column shift register for circularly shifting the shift data in accordance with an input clock signal; and at least one second column shift register for circularly shifting shift data thereof each time circulation of shift data in a previous column shift register is completed. The shift data is shifted and not circulated in case where the second column shift register is a last shift register. The group of row shift registers includes a first row shift register for circularly shifting the shift data in accordance with an input clock signal; and at least one second row shift register for circularly shifting shift data thereof each time circulation of shift data in a previous row shift register is completed. The shift data is shifted but circulated in the case where the second row shift register is a last shift register.

In another embodiment of the invention, the semiconductor memory device further includes an inverter for outputting an inverted address signal bit obtained by inverting the address signal bit. The predecoder generates the predecoded results by using the address signal bits and the inverted address signal bits.

In another embodiment of the invention, the inverter is located in the vicinity of the predecoder.

According to another aspect of the invention, an access method for a semiconductor memory device including a memory cell array including a plurality of memory cells includes the steps of: dividing a plurality of bits of an input address signal into at least two bit strings; decoding each bit string and generating predecoded results for each bit string; latching the predecoded results of the respective bit strings as shift data, respectively; generating predecoded signal bits by circularly shifting the respective shift data; and decoding the predecoded signal bits so as to select a memory cell in the memory cell array in accordance with results of the decoding.

In another embodiment of the invention, the step of generating the predecoded signal bits includes a first shift step of circularly shifting the shift data corresponding to a first bit string in accordance with a clock signal; and a second shift step of circularly shifting shift data corresponding to a second bit string each time circulation of the shift data corresponding to the first bit string is completed, the shift data being shifted but not circulated in the case where the second shift step is a last shift step of shifting shift data corresponding to a last bit string of the input address signal.

Thus, the invention described herein makes possible the advantages of (1) providing a semiconductor memory device needing less number of shift stages for a shift register by predecoding input address signals to generate predecoded results, and shifting or circularly shifting the predecoded results by a shift register to generate predecoded signals; and (2) a semiconductor memory device capable of reducing the period of time required to predecode internal addresses and reducing predecoder power consumption.

These and other advantages of the present invention will become apparent to those skilled in the art upon reading and understanding the following detailed description with reference to the accompanying figures.

BRIEF DESCRIPTION OF THE DRAWINGS

FIG. 9 is a table showing internal column address signals input to a least significant decoder of the column predecoder and the corresponding decoded results.

FIG. 10 is a table showing internal column address signals input to a most significant decoder of the column predecoder and the corresponding decoded results.

FIG. 12 is a table showing internal row address signals input to a least significant decoder of the row predecoder and the corresponding decoded results.

FIG. 13 is a table showing internal row address signals input to an intermediate decoder of the row predecoder and the corresponding decoded results.

FIG. 14 is a table showing internal row address signals input to a most significant decoder of the row predecoder and the corresponding decoded results.

DESCRIPTION OF THE PREFERRED EMBODIMENTS

Hereinafter, the present invention will be described by way of preferred embodiments with reference to the accompanying drawings.

Example 1

Figure 6:
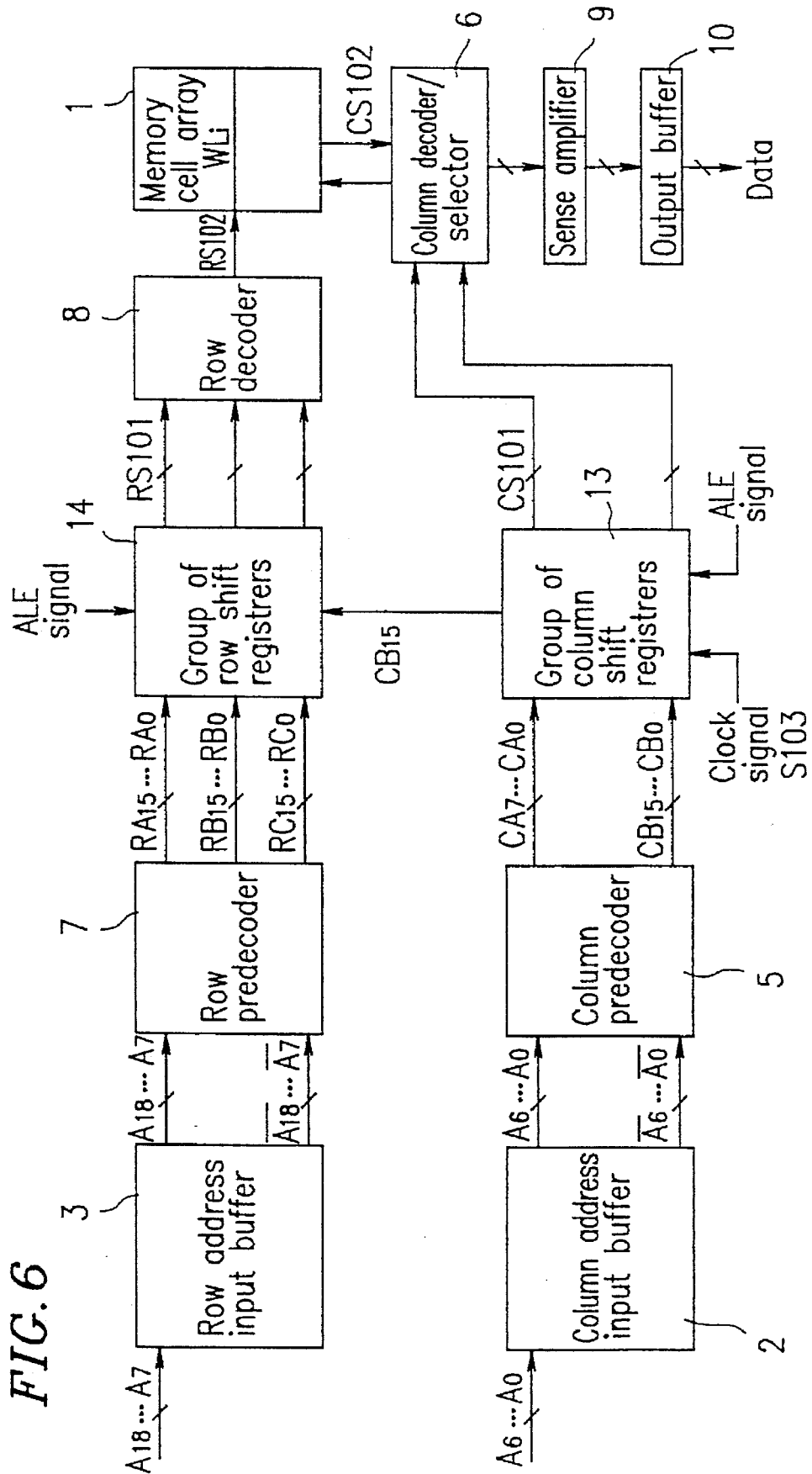
FIG. 6 is a block diagram of a semiconductor memory device according to a first embodiment of the present invention.

FIG. 6 shows a semiconductor memory device 100 according to the present invention. As shown in FIG. 6, the semiconductor memory device 100 includes a memory cell array 1, a column address input buffer 2, a row address input buffer 3, a column predecoder 5, a row predecoder 7, a group of column shift registers 13, a group of row shift registers 14, a column decoder/selector 6, a row decoder 8, a sense amplifier 9 and an output buffer 10.

First, the operation of the semiconductor memory device 100 according to the present invention will be described with reference to FIG. 6. Address signal bits are input to address buffers (i.e., the column and row address buffers 2 and 3). The address buffers generate internal address signal bits so as to output them to respective predecoders (i.e., the column predecoder 5 and the row predecoder 7). The predecoders predecode the internal address signal bits to output predecoded results. The predecoded results are supplied to a respective group of shift registers (i.e., the group of column shift registers 13 and the group of row shift registers 14). Each group of shift registers includes at least two shift registers. The predecoded results are latched in the respective shift registers as shift data, and output from the group of shift registers in parallel. The outputs (i.e., predecoded signals CS101 and RS101) from the groups of shift registers are decoded in the main decoders (i.e. the column decoder/selector 6 and the row decoder 8) to obtain selection signals CS102 and RS102, respectively. A memory cell to be accessed in the memory cell array 1 is selected by the selection signals, and thus reading and writing operations are performed for the selected memory cell.

By supplying a clock signal S103 to the first shift register of one shift register group, the shift data latched in the shift register groups are circularly shifted. As a result, the predecoded signals output from the shift register groups are changed (shifted). The main decoders selects another memory cell from the memory cell array in accordance with new selection signal bits obtained by decoding new predecoded signal bits output from the shift register groups. By further continuing to supply clock signals, circulation of the shift data in the first shift register is completed so as to return to an initial value thereof. Each time one circulation is completed in the first shift register, shift data in a next shift register is circularly shifted one bit at a time. In this manner, by shifting and changing the predecoded signals of one input address signal without changing the internal address signals input to the predecoders, all the accessible regions in the memory cell array are successively selected to perform reading and writing operations.

Accordingly, in the semiconductor memory device 100, by circularly shifting the shift data of the respective shift register groups, the predecoded signals are automatically generated to select a memory cell, thus making it possible to access the memory cell at high speed. When new selection signal bits are generated, the predecoded signal bits which are input to the main decoders are changed, whereas the internal address signal bits which are input to the predecoders are not changed. As a result, delay time for predecoding, which is required when the internal address signal bits are changed, can be reduced. In addition, power consumption due to a large amount of current needed for charging and discharging in the predecode operations of the predecoders can be reduced. Furthermore, the shift register groups do not shift fully decoded results (selection signal bits) output from the main decoders, but shift the predecoded results output from the predecoders. Thus, the number of stages of the respective shift registers can be reduced.

Furthermore, according to the semiconductor memory device 100, the group of column shift registers 13 and the group of row shift registers 14, which are connected cooperatively, generate internally all combinations of column address signal bits and row address signal bits. Thus, it is possible to access to all regions of the memory cell array 1 at high speed.

The configuration and operation of the semiconductor memory device 100 of the present invention will be described in greater detail below. In the semiconductor memory device 100 of this embodiment, the memory cell array 1 includes an address space of 19 bits, and are accessed using an address signal represented by 19 bits $A_{18}$ to $A_0$. The address signal bits $A_{18}$ to $A_0$ are divided into column address signal bits $A_6$ to $A_0$ of the least significant 7 bits and row address signal bits $A_{18}$ to $A_7$ of the most significant 12 bits.

The column address signal bits $A_6$ to $A_0$ and the row address signal bits $A_{18}$ to $A_7$ externally input are supplied to the column address input buffer 2 and the row address input buffer 3, respectively. The column address input buffer 2 and the row address input buffer 3 are buffer circuits for converting and amplifying the column address signal bits $A_6$ to $A_0$ and the row address signal bits $A_{18}$ to $A_7$ having an amplitude of an interface level to signal bits with an internal logical amplitude (internal address signal bits). The column address input buffer 2 outputs the converted and amplified internal column address signal bits $A_6$ to $A_0$ and inverted signals thereof i.e., inverted signal bits $A_6$ bar to $A_0$ bar. The row address input buffer 3 outputs converted and amplified internal row address signal bits $A_{18}$ to $A_7$ and inverted signals thereof i.e., inverted signal bits $A_{18}$ bar to $A_7$ bar.

Figure 7:
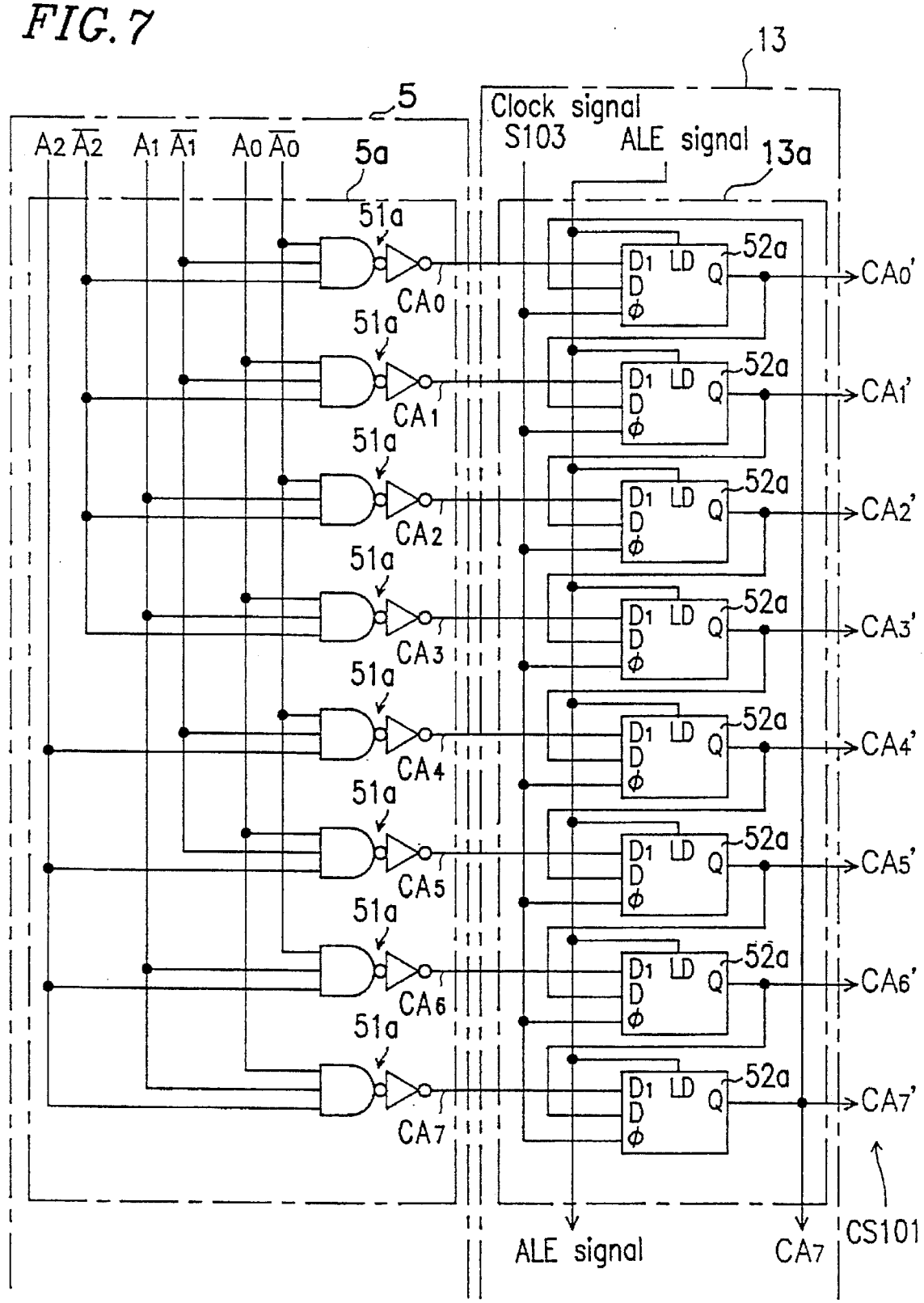
FIG. 7 is a block diagram illustrating a partial configuration of a column predecoder and a group of column shift registers of the semiconductor memory device of the first embodiment according to the present invention.

The internal column address signal bits $A_6$ to $A_0$ and the inverted signal bits $A_6$ bar to $A_0$ bar output from the column address input buffer 2 are input to the column predecoder 5. The column predecoder 5 includes a most significant decoder 5b (FIG. 8) and a least significant decoder 5a (FIG. 7). The column predecoder 5 further divides the internal column address signal bits $A_6$ to $A_0$ of 7 bits into the internal column address signal bits $A_2$ to $A_0$ of the least significant 3 bits and the internal column address signal bits $A_6$ to $A_3$ of the most significant 4 bits, and decodes the internal column address signal bits $A_2$ to $A_0$ and $A_6$ to $A_3$ in the least significant decoder 5a and the most significant decoder 5b, respectively.

As shown in FIG. 7, the least significant decoder 5a includes 8 AND gates 51a each consisting of a three-input NAND gate and an inverter. Either one of the internal column address signal bits $A_2$ to $A_0$ and the corresponding inverted signal bits $A_2$ bar to $A_0$ bar is selected for each bit of the least significant 3 bits and input to each AND gate 51a. As a result, decoded results $CA_7$ to $CA_0$ of 8 bits can be obtained.

FIG. 9 is a table of truth value showing the internal column address signal bits $A_2$ to $A_0$ and the decoded results thereof $CA_7$ to $CA_0$. As shown in FIG. 9, only either one bit of the decoded results $CA_7$ to $CA_0$ is constantly at H level in accordance with the values of the internal column address signal bits $A_2$ to $A_0$. In FIG. 9, H level is indicated by "1", and L level is indicated by "0". This holds true for the tables of truth value below.

Figure 8:
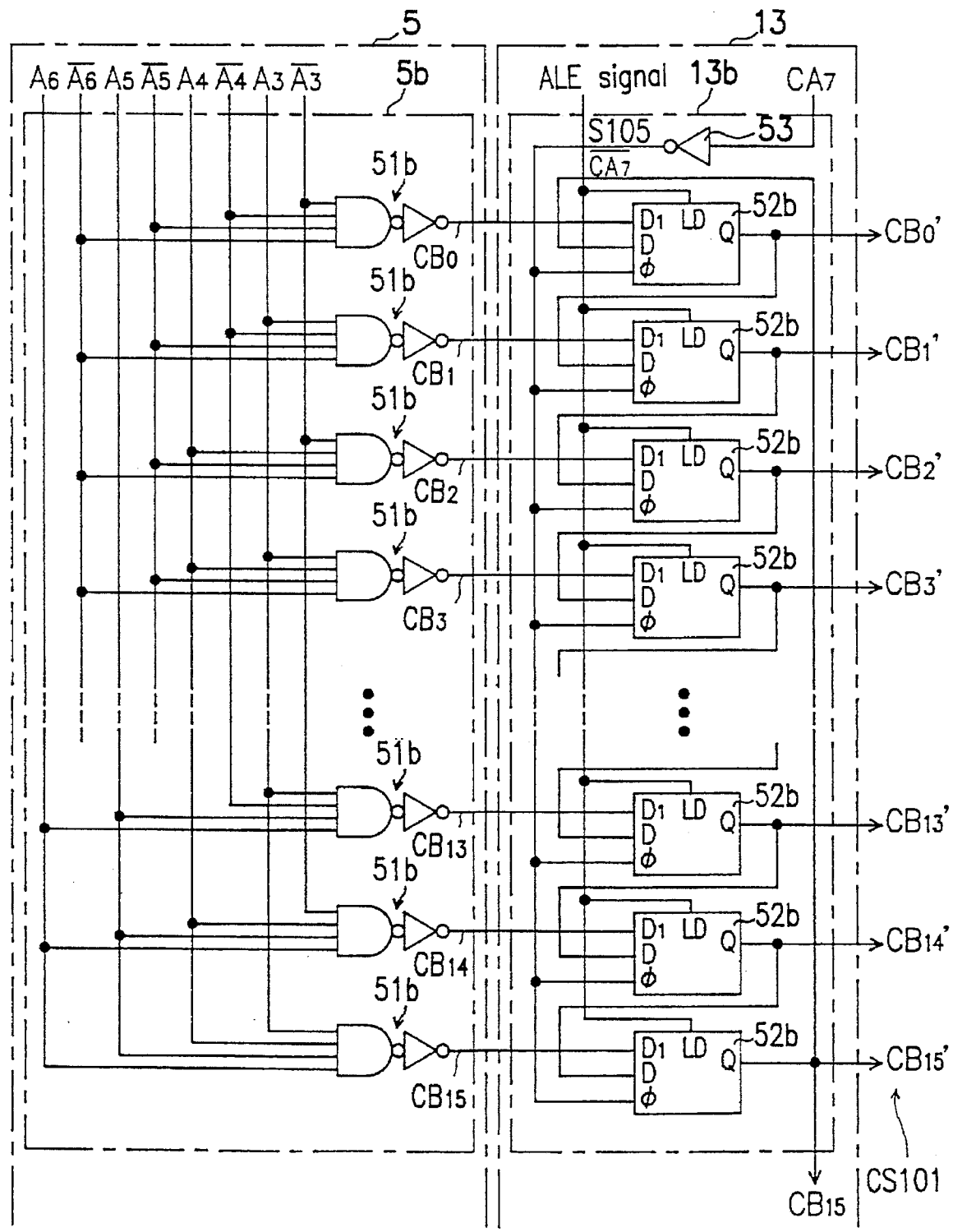
FIG. 8 is a block diagram illustrating the remaining part of the configuration of the column predecoder and the group of column shift registers of the first embodiment according to the present invention.

As shown in FIG. 8, the most significant decoder 5b includes 8 AND gates 51b each consisting of a four-input NAND gate and an inverter. Either one of the internal column address signal bits $A_6$ to $A_3$ and the corresponding inverted signal bits $A_6$ bar to $A_3$ bar is selected for each bit of the most significant 4 bits and input to each AND gate 51b. As a result, decoded results of 16 bits $CB_{15}$ to $CB_0$ can be obtained.

FIG. 10 is a table of truth value showing the internal column address signal bits $A_6$ to $A_3$ and the decoded results thereof $CB_{15}$ to $CB_0$. As shown in FIG. 10, only either one bit of the decoded results $CB_{15}$ to $CB_0$ is constantly at H level in accordance with the values of the internal column address signal bits $A_6$ to $A_0$.

The decoded results $CA_7$ to $CA_0$ and $CB_{15}$ to $CB_0$ output from the column predecoder 5 are input to the group of column shift registers 13. The group of column shift registers 13 consists of a first shift register 13a (FIG. 7) for receiving the decoded results $CA_7$ to $CA_0$ and a last shift register 13b (FIG. 8) for receiving the decoded results $CB_{15}$ to $CB_0$.

As shown in FIG. 7, the first shift registers 13a of 8 latch circuits 52a. The decoded results $CA_7$ to $CA_0$ of 8 bits output from the least significant decoder 5a of the column predecoder 5 are input to the latch circuits 52a in parallel as shift data in accordance with an ALE signal. The latched shift data is output to the column decoder/selector 6 as predecoded signals CS101. Moreover, the shift data latched in the latch circuits 52a are circularly shifted in accordance with a clock signal S103, and the shifted results are output as new predecoded signals CS101.

As shown in FIG. 8, the last shift register 13b consists of 16 latch circuits 52b. The decoded results of 16 bits $CB_{15}$ to $CB_0$ output from the most significant decoder 5b of the column predecoder 5 are input to the latch circuits 52b in parallel as shift data in accordance with an ALE signal. The latched shift data is output to the column decoder/selector 6 as predecoded signals CS101. Moreover, the shift data latched in the latch circuits 52b is circularly shifted in accordance with a signal S105 obtained by inverting the decoded result $CA_7$ output from the least significant decoder 5a by the inverter 53, and the shifted results are output as new predecoded signals CS101.

Figure 11:
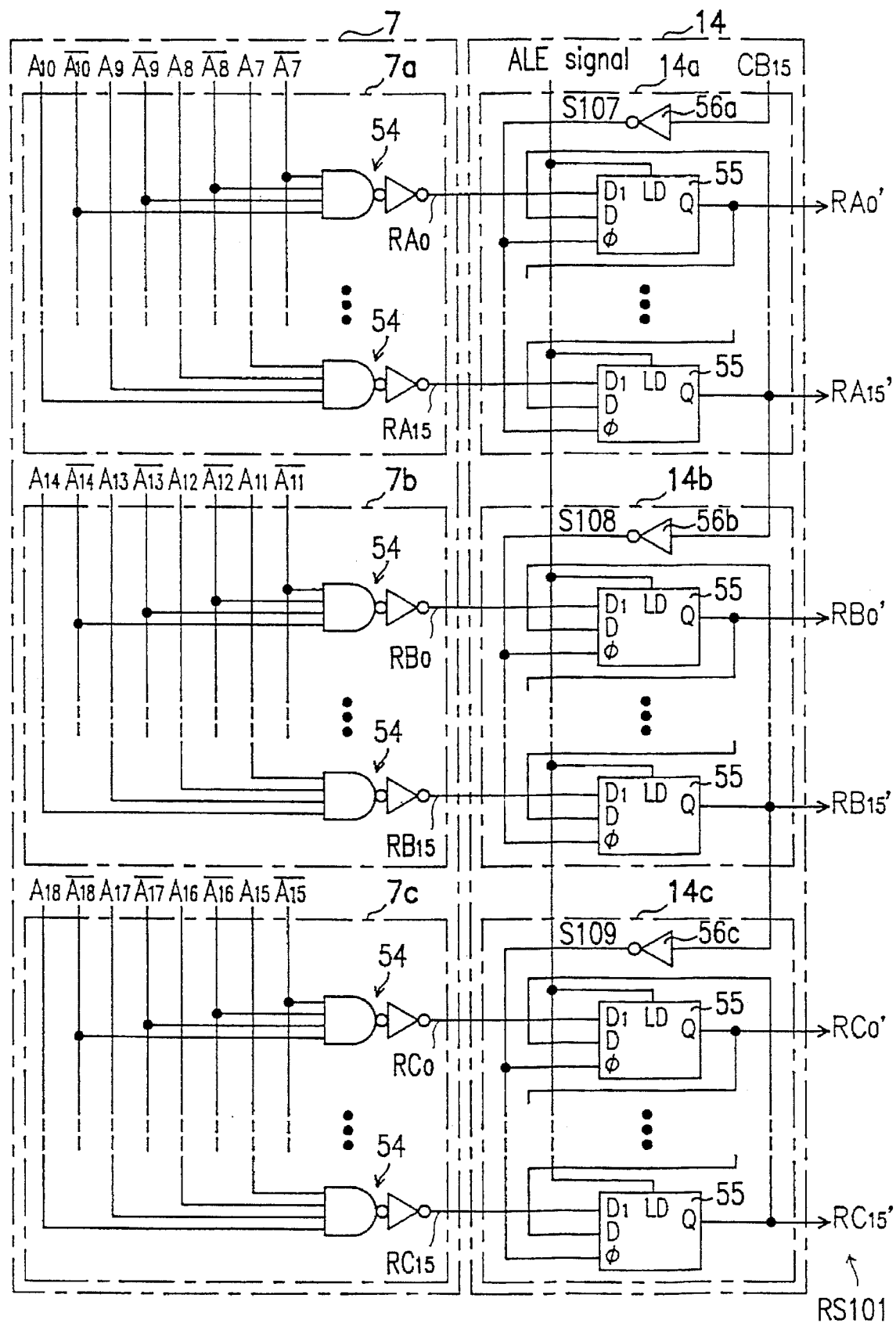
FIG. 11 is a block diagram illustrating a configuration of a row predecoder and a group of row shift registers of the semiconductor memory device of the first embodiment according to the present invention.

Referring back to FIG. 6, the internal row address signal bits $A_{18}$ to $A_7$ and the inverted signal bits $A_{18}$ bar to $A_7$ bar output from the row address input buffer 3 are input to the row predecoder 7. As shown in FIG. 11, the row predecoder 7 includes a least significant decoder 7a, an intermediate decoder 7b and a most significant decoder 7c. The row predecoder 7 further divides the internal row address signal bits of 12 bits $A_{12}$ to $A_7$ into the internal row address signal bits $A_{10}$ to $A_7$ of the least significant 4 bits, the internal row address signal bits $A_{14}$ to $A_{11}$ of the intermediate 4 bits and the internal row address signal bits to $A_{15}$ of the most significant 4 bits, and decodes the internal row address signal bits $A_{10}$ to $A_7$, $A_{14}$ to $A_{11}$ and $A_{18}$ to $A_{15}$ in the least significant decoder 7a, the intermediate decoder 7b and the most significant decoder 7c, respectively.

The configurations of the least significant decoder 7a, the intermediate decoder 7b and the most significant decoder 7c are the same as the most significant decoder 5b shown in FIG. 8, and include 16 AND gates 54 each consisting of a four-input NAND gate and an inverter. Either one of the internal row address signal bits $A_{10}$ to $A_7$ and the corresponding inverted signal bits $A_{10}$ bar to $A_7$ bar is selected for each bit of the 4 bits and input to each AND gate 54 of the least significant decoder 7a. As a result, decoded results of 16 bits $RA_{15}$ to $RA_0$ can be obtained. In the same manner, decoded results of 16 bits each $RB_{15}$ to $RB_0$ and $RC_{15}$ to $RC_0$ can be obtained from the intermediate decoder 7b and the most significant decoder 7c, respectively.

FIGS. 12 to 14 are tables of truth value showing the internal row address signal bits $A_{10}$ to $A_7$ and the decoded results thereof $RA_{15}$ to $RA_0$, the internal row address signal bits $A_{14}$ to $A_{11}$ and the decoded results thereof $RB_{15}$ to $RB_0$, and the internal row address signal bits $A_{18}$ to $A_{15}$ and the decoded results thereof $RC_{15}$ to $RC_0$. As shown in FIGS. 12 to 14, only either one bit of the decoded results $RA_{15}$ to $RA_0$, $RB_{15}$ to $RB_0$ and $RC_{15}$ to $RC_0$ is constantly at H level in accordance with the values of the internal row address signal bits $A_{10}$ to $A_7$, $A_{14}$ to $A_{11}$ and $A_{18}$ to $A_{15}$, respectively. In this manner, the decoded results of 16 bits each $RA_{15}$ to $RA_0$, $RB_{15}$ to $RB_0$ and $RC_{15}$ to $RC_0$ are output from the row predecoder 7.

The decoded results $RA_{15}$ to $RA_0$, $RB_{15}$ to $RB_0$ and $RC_{15}$ to $RC_0$ output from the row predecoder 7 are input to the group of row shift registers 14. As shown in FIG. 11, the group of row shift registers 14 includes a first shift register 14a for receiving the decoded results $RA_{15}$ to $RA_0$, an intermediate shift register 14b for receiving the decoded results $RB_{15}$ to $RB_0$ and a last shift register 14c for receiving the decoded results $RC_{15}$ to $RC_0$. Each of the shift registers 14a to 14c consists of 16 latch circuits 55.

The predecoded results of 16 bits $RA_{15}$ to $RA_0$, $RB_{15}$ to $RB_0$ and $RC_{15}$ to $RC_0$ output from the least significant, intermediate and most significant decoders 7a to 7c (respectively) of the row predecoder 7 are input to the latch circuits 55 of the corresponding shift registers 14a to 14c in parallel in accordance with an ALE signal, and latched as shift data. The shift data latched in the respective shift registers is output to the row decoder 8 as predecoded signals RS101.

Moreover, values of the shift data latched in the first shift register 14a are circularly shifted in accordance with a signal S107 obtained by inverting the decoded result $CB_{15}$ output from the last shift register 13b of the group of column shift registers 13 by the inverter 56a. The shifted values of the shift data are output as new predecoded signals RS101.

Values of the shift data latched in the intermediate shift register 14b are circularly shifted in accordance with a signal S108 obtained by inverting the decoded result $RA_{15}$ output from the first shift register 14a by the inverter 56b. Similarly, values of the shift data latched in the last shift register 14c are circularly shifted in accordance with a signal S109 obtained by inverting the decoded result $RB_{15}$ output from the intermediate shift register 14b by the inverter 56c. These shifted values of the shift data are output to the row decoder 8 as new predecoded signals RS101.

Figure 15:
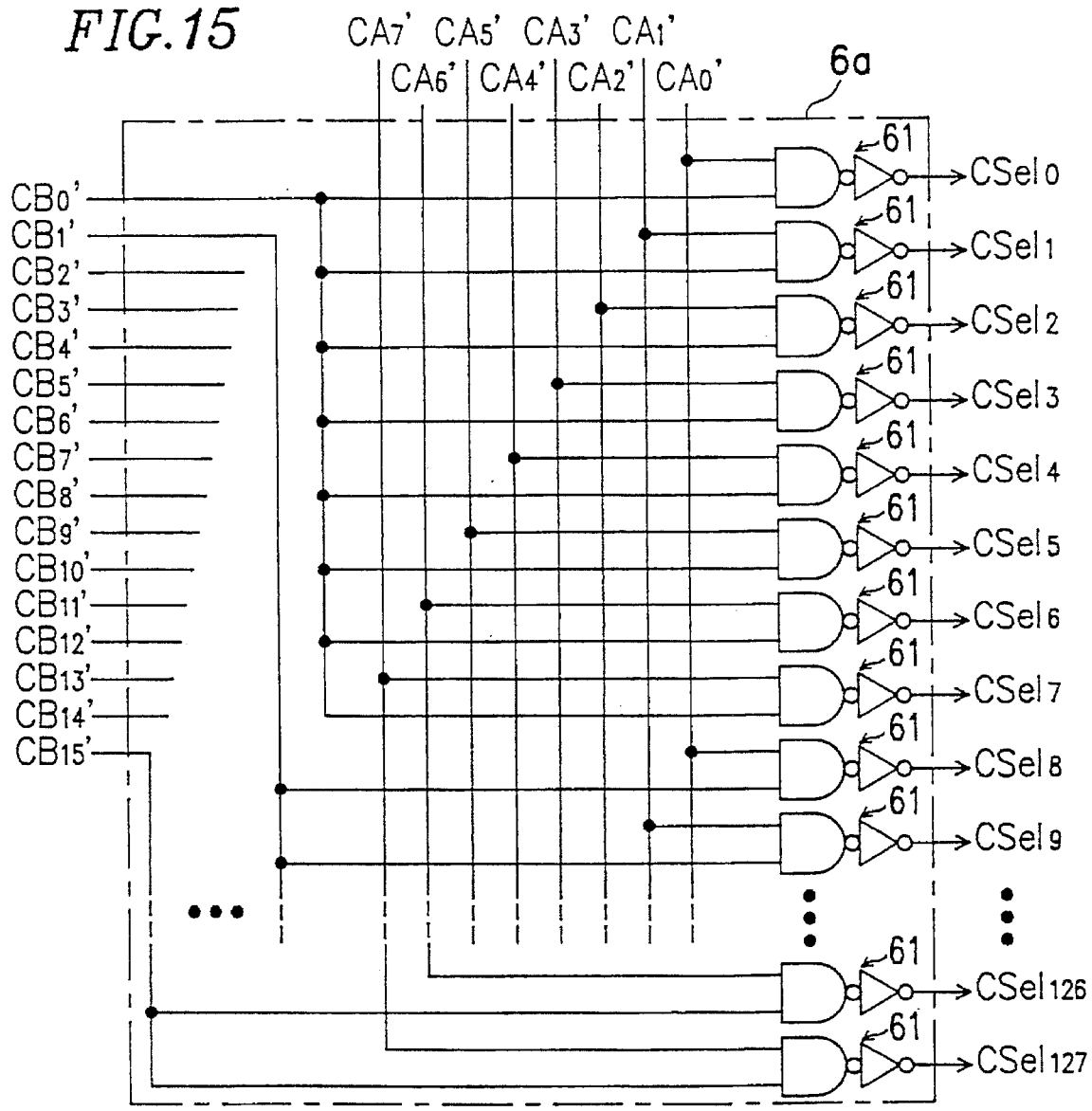
FIG. 15 is a block diagram of a column decoder in a column decoder/selector of the semiconductor memory device according to the first embodiment of the present invention.

As shown in FIG. 6, the predecoded signals CS101 (shifted predecoded results $CA_{7'}$ to $CA_{0'}$ and $CB_{15'}$ to $CB_{0'}$) output in parallel from the shift registers 13a and 13b of the group of column shift registers 13 are input to the column decoder/selector 6. As shown in FIG. 15, the column decoder/selector 6 includes a column decoder 6a including 127 (=8×16) AND gates 61 each consisting of a two-input NAND gate and an inverter, and a selector (not shown). The predecoded signals CS101 (shifted predecoded results) include the predecoded results which are once latched in the group of shift registers 13 and output without being changed (i.e, the initial predecoded results $CA_7$ to $CA_0$ and $CB_{15}$ to $CB_0$). This holds true for the predecoded signals RS101 output from the group of row shift registers 14 described later.

Figure 16:
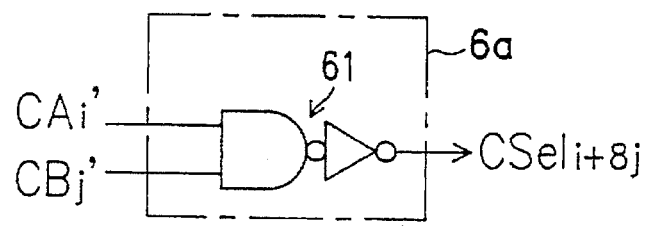
FIG. 16 is a block diagram of a partial configuration of the column decoder shown in FIG. 15.

FIG. 16 shows an AND gate 61 included in the column decoder 6a. Predecoded results $CA_i'$ and $CB_j'$ are input to the AND gate 61, and an AND operation result $CS_{a1i+8j}$ is output. Herein, the subscript i indicates an integer in the range from 0 to 7, and the subscript j indicates an integer in the range from 0 to 15. The AND gates 61 are provided with respect to all combinations of subscripts i and j. Thus, as shown in FIG. 15, the column decoder 6a includes 127 AND gates 61. The selector receives the decoded results $CS_{a10}$ to $CS_{a1127}$ to select an output bit line in the memory cell array 1 in accordance with the decoded results $CS_{a10}$ to $CS_{a1127}$.

Figure 17:
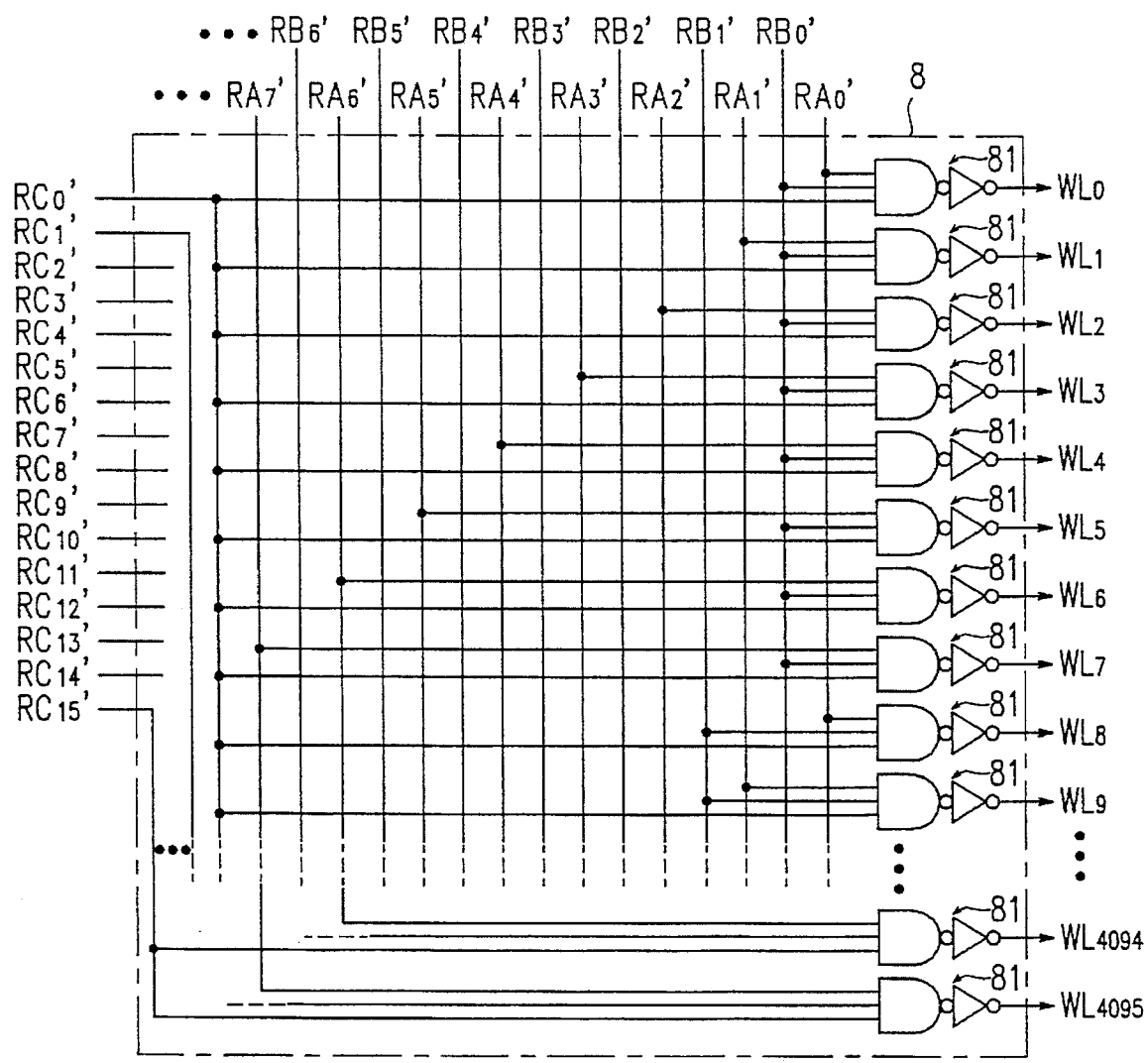
FIG. 17 is a block diagram of a row decoder of the semiconductor memory device of the first embodiment according to the present invention.
Figure 18:
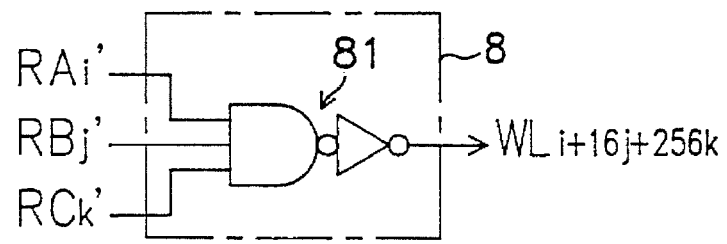
FIG. 18 is a block diagram of a partial configuration of the row decoder shown in FIG. 17.

As shown in FIG. 6, the predecoded signals RS101 (shifted predecoded results $RA_{15'}$ to $RA_{0'}$, $RB_{15'}$ to $RB_{0'}$ and $RC_{15'}$ to $RC_{0'}$) output in parallel from the shift registers 14a to 14c of the group of row shift registers 14 are input to the row decoder 8. As shown in FIG. 17, the row decoder 8 includes 4096 (=16×16×16) AND gates 81 each consisting of a three-input NAND gate and an inverter. FIG. 18 shows an AND gate 81 included in the row decoder 8. The predecoded results $RA_i$, $RB_j$ and $RC_k$ are input to the AND gate 81, and an AND operation result $WL_{i+16j+256k}$ is output. Herein, each subscript i, j and k indicates an integer in the range from 0 to 15. The AND gates 81 are provided with respect to all combinations of subscripts i, j and k. Thus, as shown in FIG. 17, the row decoder 8 includes 4096 (=16 ×16×16) AND gates 81.

Then, the row decoder 8 changes either one of the outputs from the AND gates 81 to be at H level in accordance with the predecoded signals RS101 (shifted predecoded results $RA_{15'}$ to $RA_{0'}$, $RB_{15'}$ to $RB_{0'}$ and $RC_{15'}$ to $RC_{0'}$). Thus, one word line $WL_{i+16j+256k}$ in the memory cell array 1 is selected. At this time, the column decoder/selector 6 specifies a memory cell on the selected word line $WL_{i+16j+256k}$ by selecting the output bit line in accordance with the input address signal. In the case of reading operation, the data of the specified memory cell is amplified in the sense amplifier 9 and the amplified result is output to an external data bus or the like via the output buffer 10.

Figure 19:
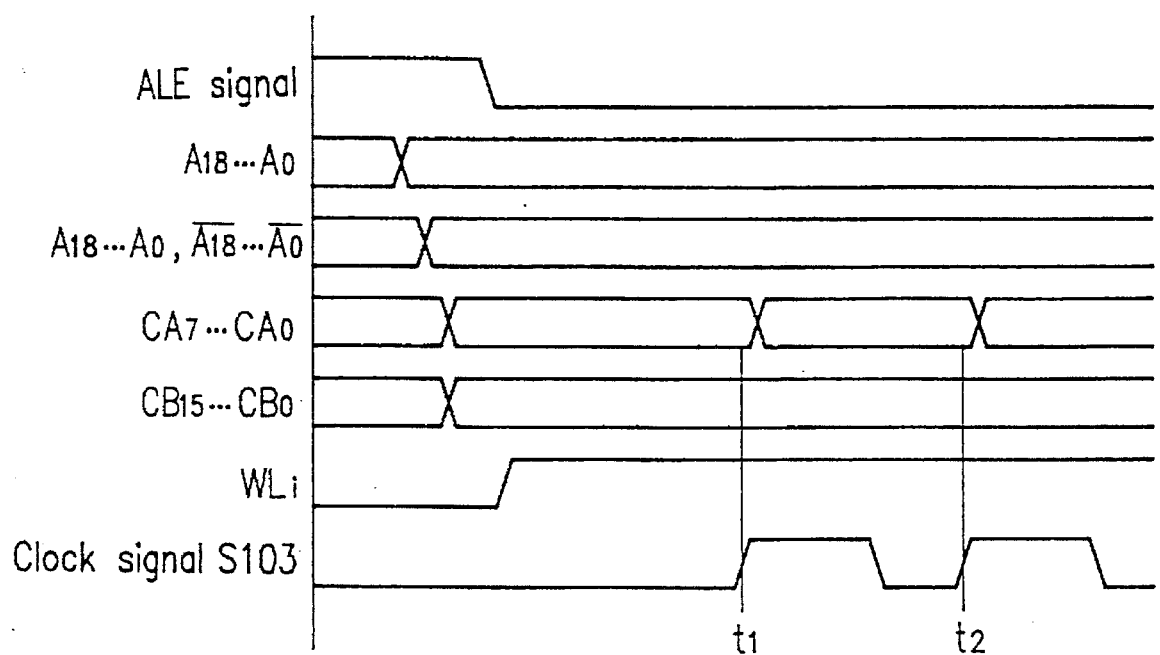
FIG. 19 is a timing chart showing the operation of the semiconductor memory device of the first embodiment according to the present invention.

FIG. 19 shows the operation of the semiconductor memory device 100. As shown in FIG. 19, in the semiconductor memory device 100, after the access by the designation of the externally input address signal bits $A_{18}$ to $A_0$ is completed, the group of column shift registers 13 performs shifting operation at a time t1 or a time t2 when a clock signal goes high so that values of shift data in the first shift register 13a are circularly shifted. By the shift operation, each time circulation of the shift data in the first shift register 13a is completed, shift data in the last shift register 13b is shifted to the next stage.

Then, each time circulation of the shift data in the last shift register 13b is completed, shift data in the first shift register 14a of the group of row shift register 14 is shifted to the next stage. Similarly, each time circulation of the shift data in the first shift register 14a is completed, shift data in the intermediate shift register 14b is shifted to the next stage. Furthermore, each time circulation of the shift data in the intermediate shift register 14b is completed, shift data in the last shift register 14c is shifted to the next stage.

Since the last shift register 14c is the final shift register, the shifting is not necessarily performed in the circular shift, but a simple shift (logical shift) is sufficient. However, in this embodiment, the decoded result $RC_{15'}$, i.e., an output from the final latch circuit 55 of the last shift register 14c returns back to the first latch circuit 55. Thus, it is possible to continue the operation of access by returning back to the first address after the final address of the memory cell array 1 is accessed. The above-mentioned operation that the circular shift occurs at each time of finishing one circulation is not limited to the case where only at the time when circulation of shift data in a previous shift register is completed, shift data in the current shift register is circularly shifted, but includes the case where at any given timing during one circulation of the values of shift data in the previous shift register, one circular shift necessarily occurs and the circular shift does not occur more than twice.

In this manner, in the semiconductor memory device 100, the values of the shift data of the group of column shift registers 13 and the group of row shift registers 14 are circularly shifted in accordance with the clock signal S103. As a result, predecoded signal bits can be successively and automatically generated. Thus, it is possible to sequentially access successive addresses at high speed without externally supplying new address signal bits. Furthermore, by the circular shift in the group of column shift registers 13 and the group of row shift registers 14, signal bits input to the column decoder/selector 6 and the row decoder 8 are changed, whereas the internal addresses input to the column predecoder 5 and the row predecoder 7 are not changed. Accordingly, a delay period necessary to predecode in the column predecoder 5 and the row predecoder 7 can be eliminated, thus making it possible to further promote high speed access operation. In addition, power consumption due to a large amount of charged and discharged current by predecoding the internal address can be reduced.

Figure 1:
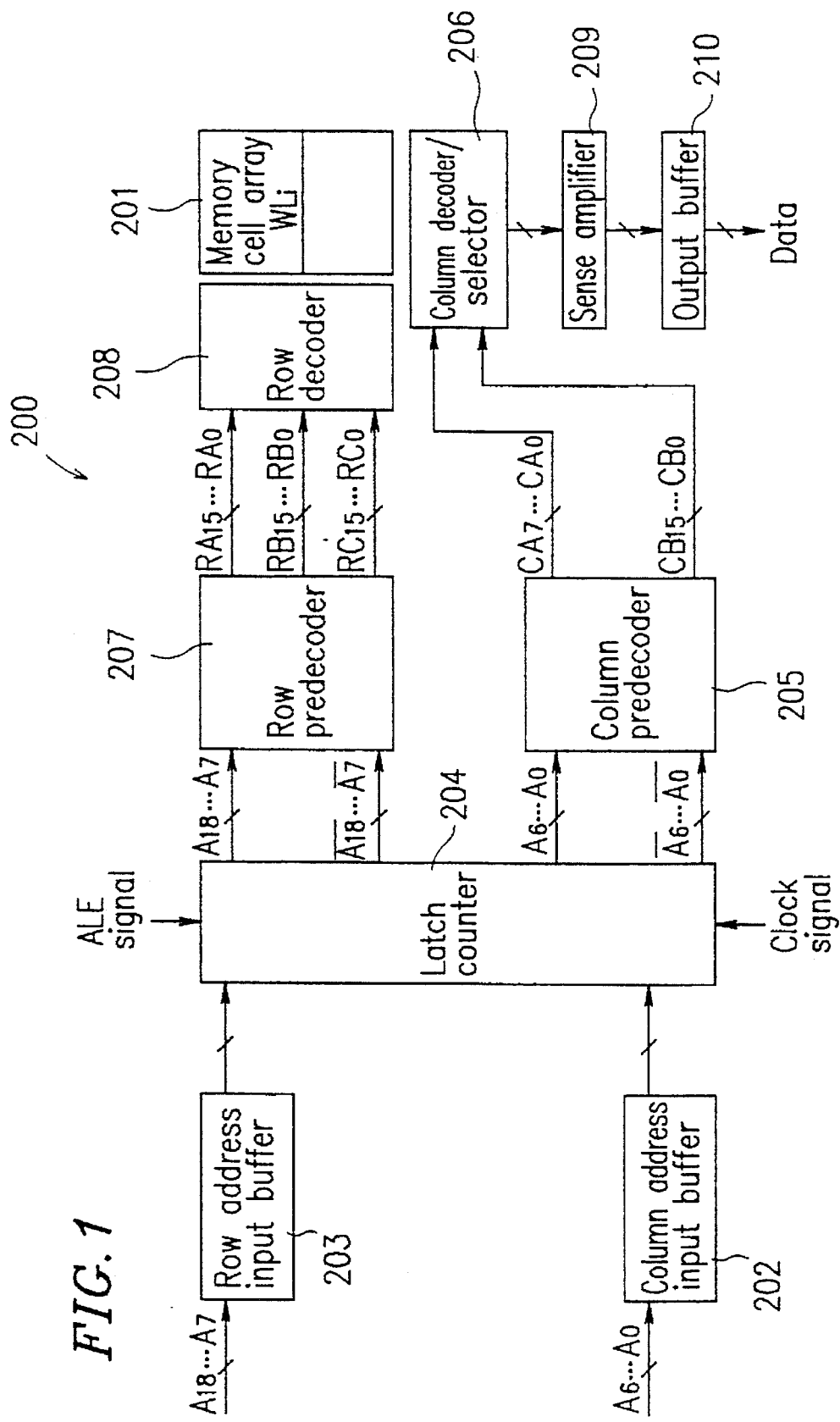
FIG. 1 is a block diagram of a conventional semiconductor memory device.
Figure 2:
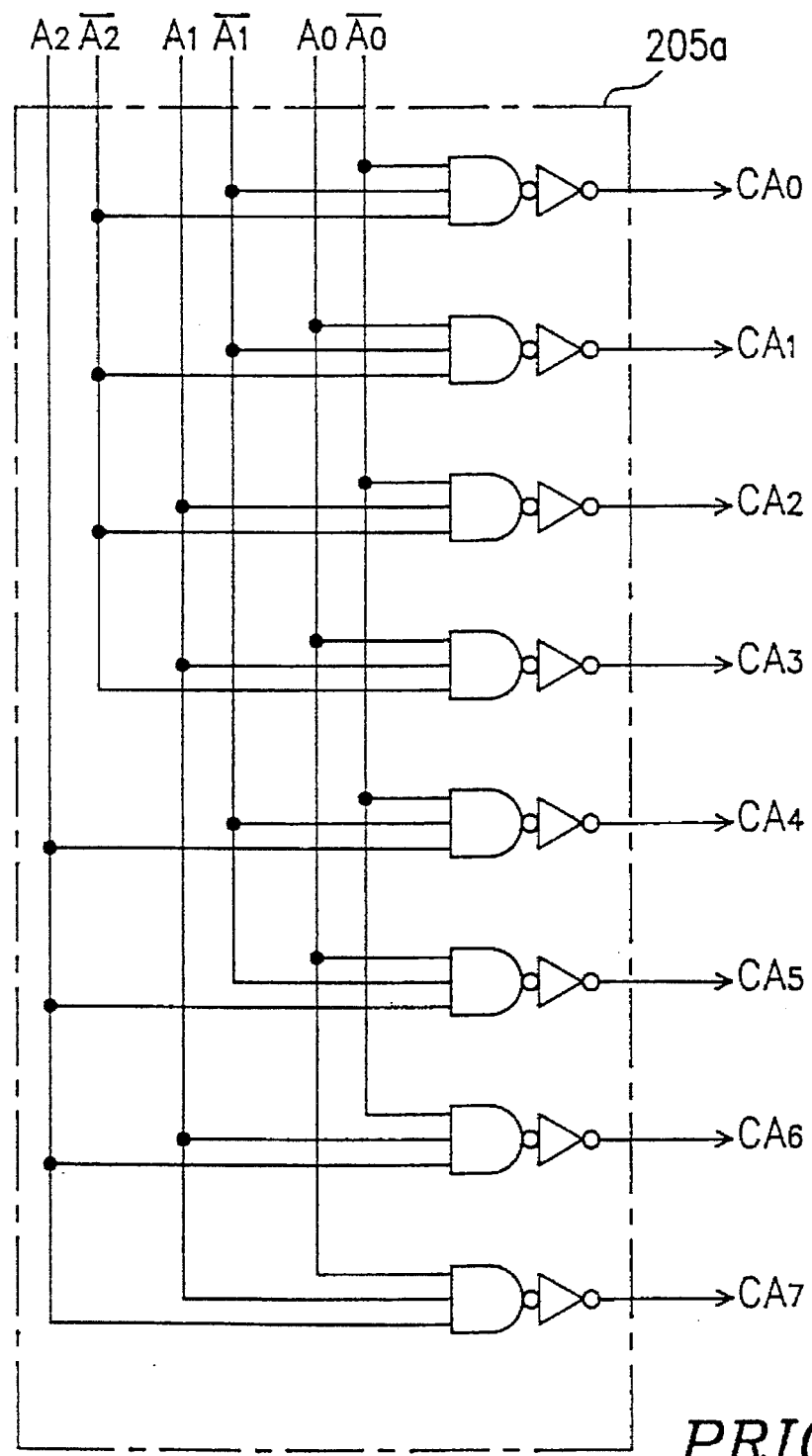
FIG. 2 is a block diagram of a least significant decoder of a column predecoder of a conventional semiconductor memory device of FIG. 1.
Figure 3:
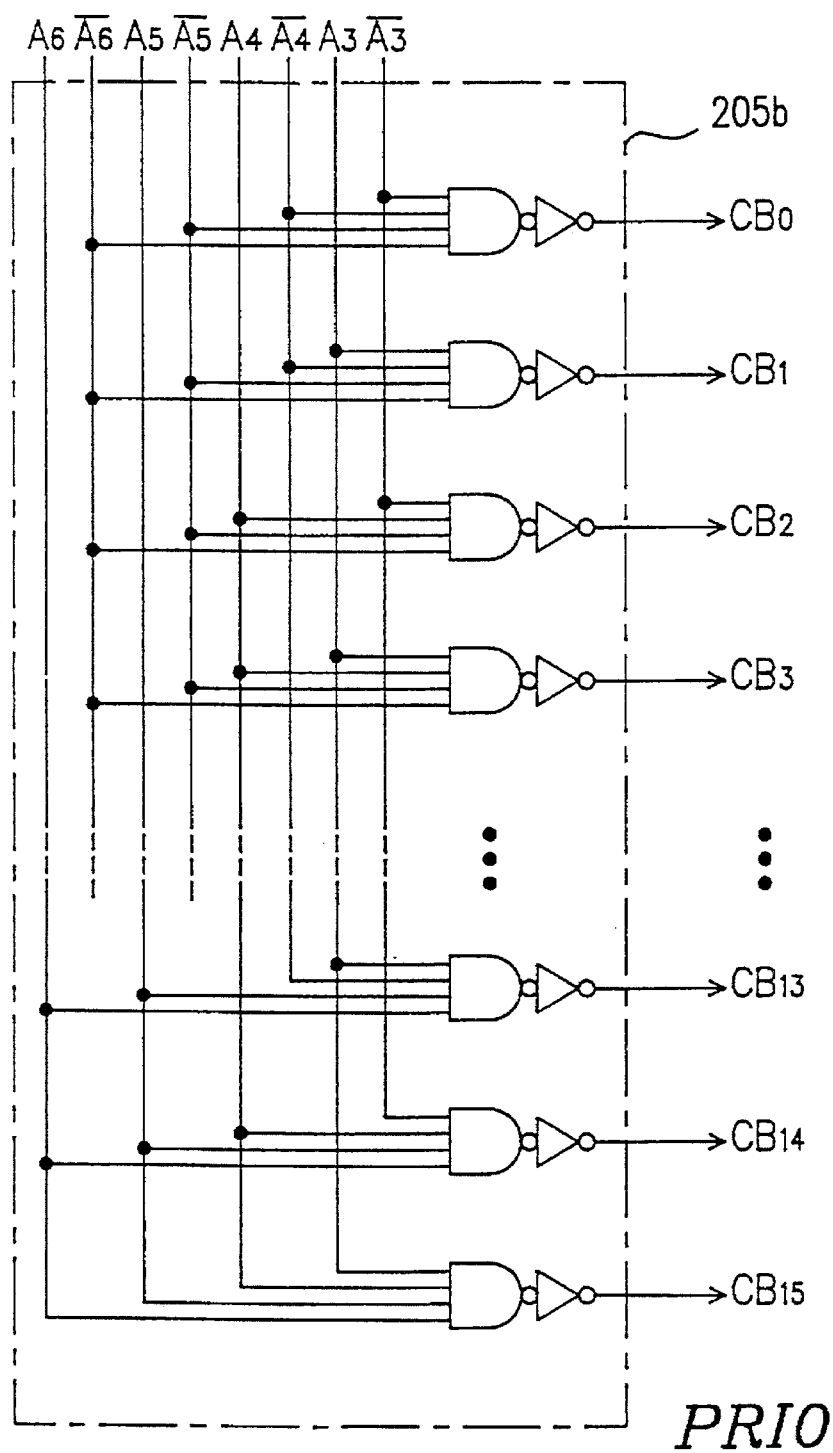
FIG. 3 is a block diagram of a most significant decoder of a column predecoder of a conventional semiconductor memory device.
Figure 4:
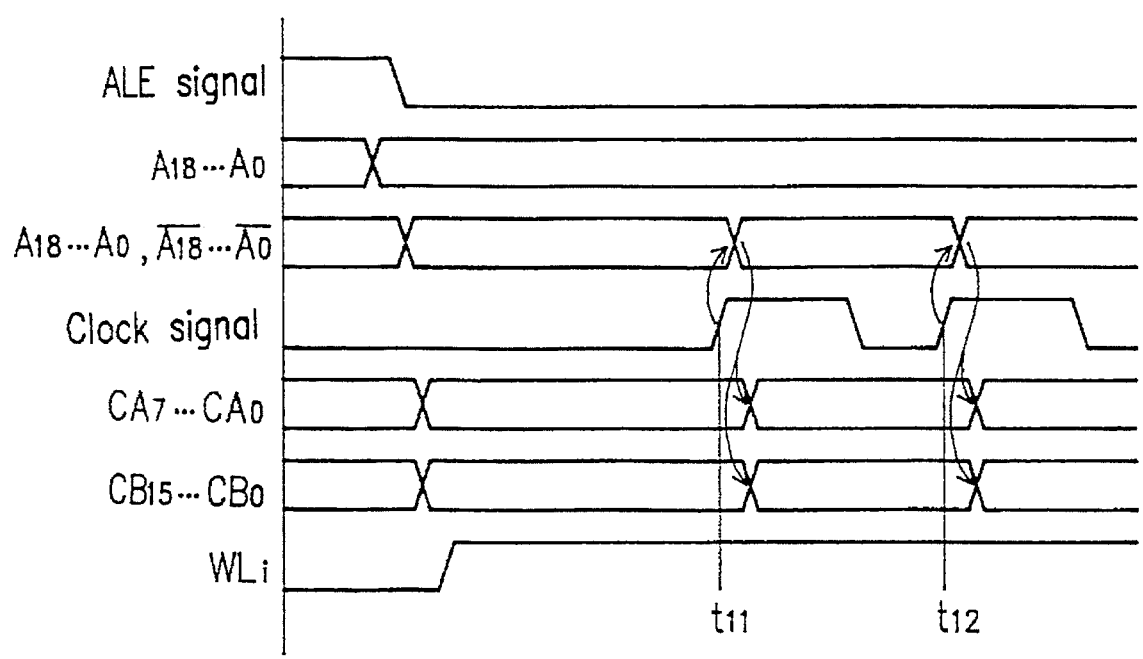
FIG. 4 is a timing chart showing the operation of the conventional semiconductor memory device.
Figure 5:
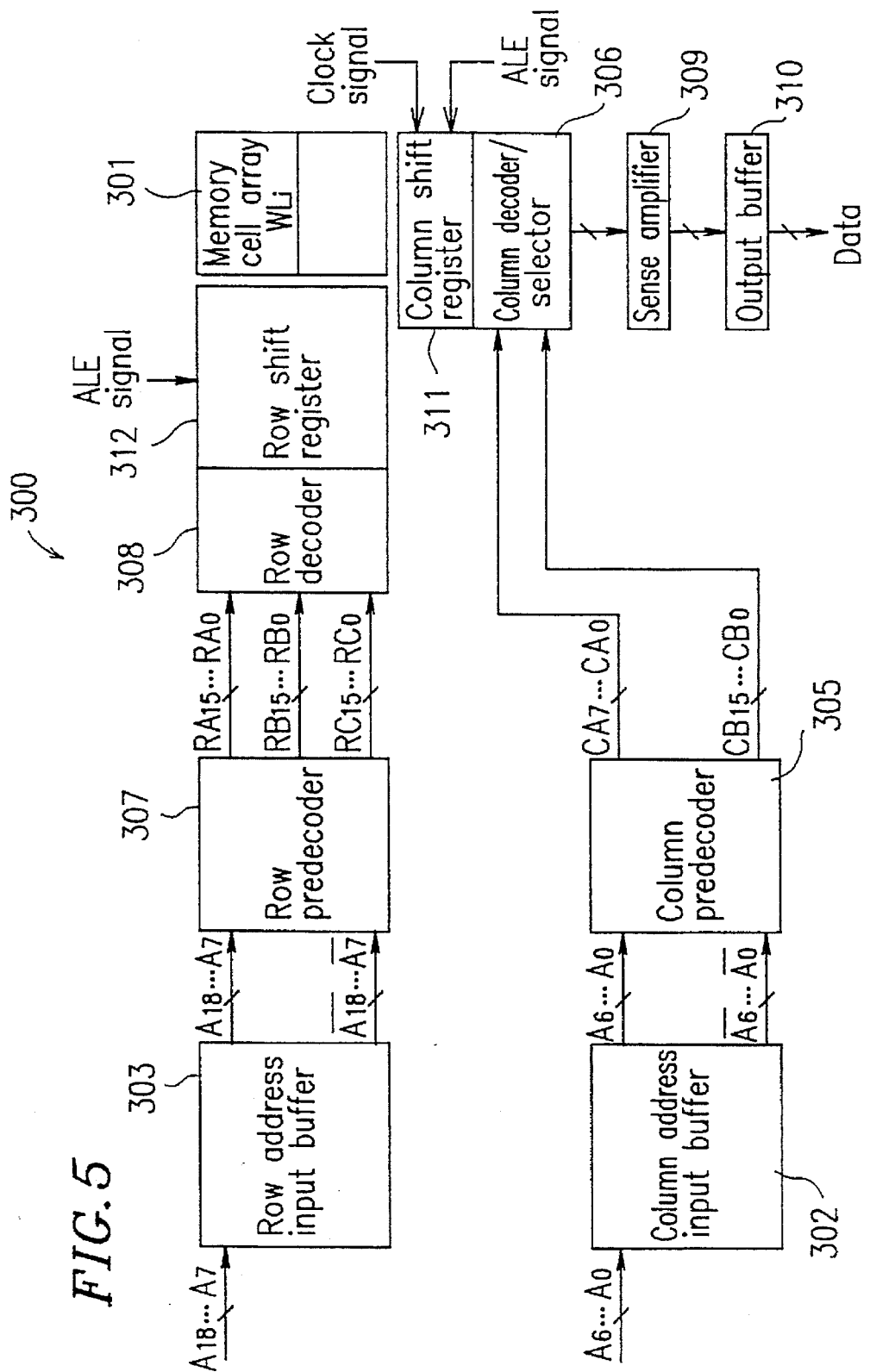
FIG. 5 is a block diagram of another conventional semiconductor memory device.

Furthermore, the group of column shift registers 13 and the group of row shift registers 14 use intermediate decoded results from the column predecoder 5 and the row predecoder 7 as shift data. As a result, the number of stages for shifting can be reduced, and a layout area for the group of column shift registers 13 and the group of row shift registers 14 to occupy in the chip can be made smaller. For example, in the conventional semiconductor memory device 300 shown in FIG. 5, the numbers of stages of the group of column shift registers 311 and the group of row shift registers 312 are 128 and 4096, respectively. On the other hand, in the semiconductor memory device 100 of Example 1 shown in FIG. 6, the number of stages of the group of column shift registers 13 (i.e., the sum of the first shift register 13a and the last shift register 13b) is 24 (=8 +16), and the number of the group of row shift registers 14 (i.e., the sum of all the shift registers 14a to 14c) is 48 (=16+ 16+16). In both groups of shift registers, the number of stages can be significantly reduced.

Furthermore, the predecoded results from the column predecoder 5 and the row predecoder 7 are used as shift data for the group of column shift registers 13 and the group of row shift registers 14. The number of bits of the predecoded results is sufficiently small when compared with the decoded results from the column decoder/selector 6 and the row decoder 8. Thus, in the case where a remedy mechanism (utilizing a redundant cell as a substitute) is provided for an unsatisfactory cell generated in the memory cell array 1, the address of the unsatisfactory cell can be stored in a form of the predecoded results from the column predecoder 5 and the row predecoder 7. Thus, even if an address counter for counting the generated internal addresses is not provided, the predecoded signals output from the group of column shift registers 13 and the group of row shift registers 14 can be directly compared with the predecoded results indicating the address of the unsatisfactory cell, thus detecting whether or not the address indicated by the generated predecoded signal is directed to the unsatisfactory cell. Accordingly, it is not necessary to provide an extra address counter so that circuit configuration can be significantly made smaller. However, when compared with the case where the address of the unsatisfactory cell is stored in the form of address signal bits $A_{18}$ to $A_0$, the memory capacity may be slightly wasted.

Example 2

Figure 20:
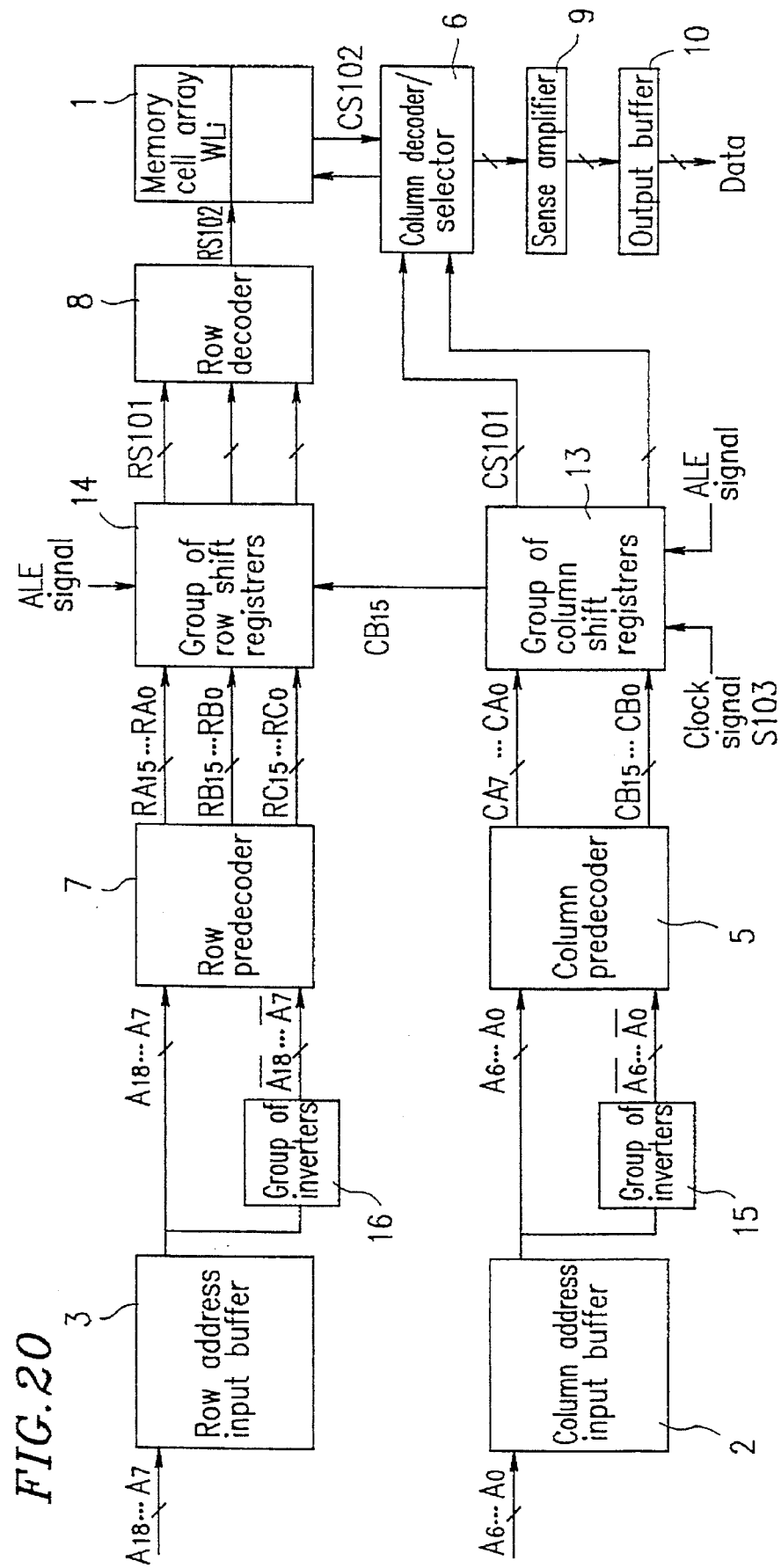
FIG. 20 is a block diagram of a semiconductor memory device of a second embodiment according to the present invention.

FIG. 20 shows a configuration of a semiconductor memory device 110 according to a second embodiment of the present invention. The components having the same functions as those of the semiconductor memory device 100 of Example 1 (FIGS. 6 to 8, 11, and 15 to 19) bear the same reference numerals, therefore the explanation will be omitted.

In the semiconductor memory device 110 of this embodiment, a column address input buffer 2 and a row address input buffer 3 output only column address signal bits $A_6$ to $A_0$ and row address signal bits $A_{18}$ to $A_7$, but do not output inverted signal bits $A_6$ bar to $A_0$ bar and $A_{18}$ bar to $A_7$ bar. Moreover, as shown in FIG. 20, groups of inverters 15 and 16 consisting of a plurality of inverters are provided between the column address input buffer 2 and a column predecoder 5, and the row address input buffer 3 and a row predecoder 7, respectively. The groups of inverters 15 and 16 are provided in the vicinity of the column predecoder 5 and the row predecoder 7.

The column address signal bits $A_6$ to $A_0$ output from the column address input buffer 2 are input to the group of inverters 15, and inverted for each bit to be supplied to the column predecoder 5 as inverted signal bits $A_6$ bar to $A_0$ bar. The row address signal bits $A_{18}$ to $A_7$ output from the row address input buffer 3 are input to the group of inverters 16, and inverted for each bit to be supplied to the row predecoder 7 as inverted signal bits $A_{18}$ bar to $A_7$ bar.

According to the semiconductor memory device 110 having the above-mentioned configuration, the column address input buffer 2 and the row address input buffer 3 output only the column address signal bits $A_6$ to $A_0$ and the row address signal bits $A_{18}$ to $A_7$. As a result, it is not necessary to provide signal lines for the inverted signal bits $A_6$ bar to $A_0$ bar and $A_{18}$ bar to $A_7$ bar. Thus, a layout area can be reduced by the area which is otherwise required for the provision of lines. The column predecoder 5 and a row predecoder 7 can operate in the same manner as those of Example 1 because they receive inverted signal bits $A_6$ bar to $A_0$ bar and $A_{18}$ bar to $A_7$ bar from the groups of inverters 15 and 16 provided in the vicinity thereof. The configurations and operations of the group of column shift registers 13, the group of row shift registers 14, the column decoder/selector 6 and the row decoder 8 are the same as in Example 1.

As described above, the semiconductor memory device of the present invention uses respective decoded results from predecoders as shift data of respective shift registers in groups of shift registers to perform circular shift in the respective shift registers. As a result, predecoded signal bits are automatically generated, thus making high speed access operation possible.

Furthermore, new predecoded signal bits are generated by circular shift in the groups of shift registers. As a result, only the predecoded signal bits input to main decoders are changed, but internal addresses input to the predecoders are not changed. Thus, a delay period of time necessary to predecode changed internal addresses and power consumption due to a large amount of charged and discharged current by the operation of the predecoders can be eliminated. According to the present invention, since time delay and power consumption are mainly caused by the main decoders, high speed access operation can be further promoted and power consumption can be further reduced.

Furthermore, the groups of shift registers do not shift the decoded results (selection signals), but shift the predecoded results (predecoded signals) from the predecoders. Accordingly, the number of stages of respective shift registers can be reduced. Thus, having to enlarge a layout area for the groups of shift registers occupied on a chip can be avoided.

Furthermore, the address of an unsatisfactory cell can be detected without providing an extra address counter.

Generally, in the semiconductor memory device, address signal bits are divided into column address signal bits and row address signal bits to be decoded. Then, a memory cell is selected from the memory cell array in a matrix by selection signal bits generated in accordance with the decoded results. Accordingly, by practicing the present invention in terms of at least one of the column address signal bits and the row address signal bits, predecoded signal bits corresponding to the column address signal bits or the row address signal bits can be internally generated, thus making it possible to access regions of the memory cell array at high speed by the generated predecoded signal bits.

Furthermore, in the case where each decoder decodes using input address signal bits and inverted signal bits, the inverted signal bits are generated by groups of inverters provided in the vicinity of the decoders. Thus, a layout area for providing signal lines for the inverted signal bits can be reduced.

Furthermore, the logical circuit used in the present invention can be any logical circuit as long as it can substantially perform a selection operation using logical generates. Therefore, it is not necessarily limited to an AND gate, but the logical circuit can be constituted by an NAND gate and an OR gate.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device comprising a memory cell array including a plurality of memory cells, the device comprising:

a predecoder for dividing a plurality of bits of an address signal into at least two bit strings so as to decode each bit string and output predecoded results of each bit string in parallel;

a series of shift registers, each shift register being provided for a respective bit string, receiving the predecoded results of the corresponding bit string as shift data, shifting the received shift data, thereby generating and outputting predecoded signal bits; and a main decoder for decoding the predecoded signal bits output from the plurality of shift registers and selecting a memory cell in the memory cell array in accordance with the results of the decoding.

2. A semiconductor memory device according to claim 1, wherein the series of shift registers comprises:

a first shift register provided for a first bit string, for circularly shifting the shift data in accordance with an input clock signal;

at least one second shift register provided for at least one second bit string, for circularly shifting shift data thereof each time circulation of shift data in a previous shift register is completed, the shift data being shifted but not circulated in the case where the second shift register is a last shift register.

3. A semiconductor memory device according to claim 1, wherein the address signal bit string includes a column address signal bit string and a row address signal bit string, each having a respective plurality of bits;

the predecoder includes a column predecoder and a row predecoder provided for the column address signal bits and the row address signal bits, respectively, the column predecoder and the row predecoder outputting column and row predecoded results in parallel, respectively;

the series of shift registers includes group of column shift registers and a group of row shift registers provided for the column predecoder and the row predecoder, respectively, the group of column shift registers receiving the column predecoded results so as to generate column predecoded signal bits, the group of row shift registers receiving the row predecoded results so as to generate row predecoded signal bits; and the main decoder includes a column decoder and a row decoder, the column decoder decoding the column predecoded signal bits and thereby selecting a column address of the memory cells in the memory cell array, the row decoder decoding the row predecoded signal bits and thereby selecting a row address of the memory cells in the memory cell array.

4. A semiconductor memory device according to claim 3, wherein the group of column shift registers comprising:

a first column shift register for circularly shifting the shift data in accordance with an input clock signal;

at least one second column shift register for circularly shifting shift data thereof each time circulation of shift data in a previous column shift register is completed, the shift data being shifted but not circulated in case where the second column shift register is a last shift register; and the group of row shift registers comprising:

a first row shift register for circularly shifting the shift data in accordance with an input clock signal;

at least one second row shift register for circularly shifting shift data thereof each time circulation of shift data in a previous row shift register is completed, the shift data being shifted but not circulated in the case where the second row shift register is a last shift register.

5. A semiconductor memory device according to claim 1, further comprising an inverter for outputting an inverted address signal bit obtained by inverting the address signal bit, wherein the predecoder generates the predecoded results by using the address signal bits and the inverted address signal bits.

6. A semiconductor memory device according to claim 5, wherein the inverter is located in the vicinity of the predecoder.

7. An access method for a semiconductor memory device comprising a memory cell array including a plurality of memory cells, the method comprising the steps of:

dividing a plurality of bits of an input address signal into at least two bit strings; decoding each bit string and generating predecoded results for each bit string;

latching the predecoded results of the bit strings as shift data, respectively; generating predecoded signal bits by circularly shifting the respective shift data; and decoding the predecoded signal bits so as to select a memory cell in the memory cell array in accordance with results of the decoding.

8. An access method for a semiconductor memory device according to claim 7, wherein the step of generating the predecoded signal bits comprises:

a first shift step of circularly shifting the shift data corresponding to a first bit string in accordance with a clock signal; and a second shift step of circularly shifting shift data corresponding to a second bit string each time circulation of the shift data corresponding to the first bit string is completed, the shift data being shifted but not circulated in the case where the second shift step is a last shift step of shifting shift data corresponding to a last bit string of the input address signal.

* * * * *